(12) United States Patent
Himori et al.

(10) Patent No.: US 7,767,055 B2
(45) Date of Patent: Aug. 3, 2010

(54) CAPACITIVE COUPLING PLASMA PROCESSING APPARATUS

(75) Inventors: Shinji Himori, Nirasaki (JP); Noriaki Imai, Nirasaki (JP); Katsumi Horiguchi, Amagasaki (JP); Takaaki Nezu, Nirasaki (JP); Shoichiro Matsuyama, Nirasaki (JP); Hiroki Matsumaru, Nirasaki (JP); Toshihiro Hayami, Nirasaki (JP); Kazuya Nagaseki, Nirasaki (JP); Itsuko Sakai, Yokohama (JP); Tokuhisa Ohiwa, Kawasaki (JP); Yoshikazu Sugiyasu, Nirasaki (JP)

(73) Assignees: Tokyo Electron Limited, Tokyo (JP); Kabushiki Kaisha Toshiba, Tokyo (JP)

(*) Notice: Subject to any disclaimer, the term of this patent is extended or adjusted under 35 U.S.C. 154(b) by 1040 days.

(21) Appl. No.: 11/292,353

(22) Filed: Dec. 2, 2005

(65) Prior Publication Data
US 2006/0118044 A1    Jun. 8, 2006

Related U.S. Application Data

(60) Provisional application No. 60/658,155, filed on Mar. 4, 2005.

(30) Foreign Application Priority Data

Dec. 3, 2004  (JP) .............................. 2004-350998
Nov. 15, 2005 (JP) .............................. 2005-330251

(51) Int. Cl.
   *C23F 1/00*    (2006.01)
   *H01L 21/306* (2006.01)
   *C23C 16/00*  (2006.01)

(52) U.S. Cl. .............................. 156/345.47; 118/723 E (58) Field of Classification Search ................. 118/715, 118/722, 723 R, 723 E; 156/345.43, 345.44, 156/345.46, 345.47
See application file for complete search history.

(56) References Cited

U.S. PATENT DOCUMENTS

| 5,272,417 A * | 12/1993 | Ohmi .................... 315/111.21 |
| 5,478,429 A * | 12/1995 | Komino et al. ......... 156/345.44 |
| 6,391,787 B1 * | 5/2002 | Dhindsa et al. ............ 438/710 |
| 2004/0020431 A1 | 2/2004 | Himori et al. ............ 118/723 E |

FOREIGN PATENT DOCUMENTS

| CN | 1518073 A | 8/2004 |
| JP | 2000-323456 | 11/2000 |
| JP | 2003-297810 | 10/2003 |
| JP | 2004-235623 | 8/2004 |

* cited by examiner

*Primary Examiner*—Parviz Hassanzadeh
*Assistant Examiner*—Maureen Gramaglia
(74) *Attorney, Agent, or Firm*—Oblon, Spivak, McClelland, Maier & Neustadt, L.L.P.

(57) ABSTRACT

A capacitive coupling plasma processing apparatus includes a process chamber configured to have a vacuum atmosphere, and a process gas supply section configured to supply a process gas into the chamber. In the chamber, a first electrode and a second electrode are disposed opposite each other. An RF power supply is disposed to supply an RF power to the first or second electrode to form an RF electric field within a plasma generation region between the first and second electrodes, so as to turn the process gas into plasma. The target substrate is supported by a support member between the first and second electrodes such that a process target surface thereof faces the second electrode. A conductive functional surface is disposed in a surrounding region around the plasma generation region and grounded to be coupled with the plasma in a sense of DC to expand the plasma.

17 Claims, 10 Drawing Sheets

CAPACITIVE COUPLING PLASMA PROCESSING APPARATUS

CROSS-REFERENCE TO RELATED APPLICATIONS

This application claims the benefit of U.S. Provisional Application No. 60/658,155, filed Mar. 4, 2005.

This application is based upon and claims the benefit of priority from prior Japanese Patent Applications No. 2004-350998, filed Dec. 3, 2004; and No. 2005-330251, filed Nov. 15, 2005, the entire contents of both of which are incorporated herein by reference.

BACKGROUND OF THE INVENTION

1. Field of the Invention

The present invention relates to a plasma processing apparatus of the capacitive coupling type, used for performing a plasma process on a target substrate in, e.g. a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

For example, in manufacturing semiconductor devices, plasma processes, such as etching, sputtering, and CVD (Chemical Vapor Deposition), are often used for processing a target substrate or semiconductor wafer. There are various plasma processing apparatuses for performing such plasma processes, but parallel-plate plasma processing apparatuses of the capacitive coupling type are the ones in mainstream use.

In general, a parallel-plate plasma etching apparatus of the capacitive coupling type includes a process chamber with a pair of parallel-plate electrodes (upper and lower electrodes) disposed therein. When a process is performed, while a process gas is supplied into the chamber, an RF (radio frequency) power is applied to one of the electrodes to form an RF electric field between the electrodes, thereby causing RF electric discharge. The process gas is turned into plasma by the RF electric field, thereby performing, e.g. plasma etching on a predetermined layer disposed on a semiconductor wafer.

For example, there is an apparatus of this kind in which an RF power is applied to the lower electrode on which the semiconductor wafer is placed. In this case, the lower electrode serves as a cathode electrode, and the upper electrode serves as an anode electrode. The RF power applied to the lower electrode is used for plasma generation and also for an RF bias applied to the target substrate.

In the parallel-plate plasma processing apparatus of the capacitive coupling type, members present in the plasma generation region need to be protected from metal contamination and wear-out. For this reason, these members are made of quartz or formed of a body covered with a coating of an insulative ceramic with high resistance to plasma, such as $Y_2O_3$.

In recent years, design rules in manufacturing semiconductor devices have been increasingly miniaturized. Particularly, in plasma etching, it is required to improve the dimensional accuracy, selectivity relative to the mask and under-layer, and planar uniformity of the etching. For this reason, the recent trend is to use a lower pressure and lower ion energy in the process field within a chamber. This trend has brought about a use of an RF power with a frequency of 40 MHz or more, which is far higher than the frequency conventionally used.

However, where a lower pressure and lower ion energy are used, as described above, it becomes difficult to control the plasma uniformity because of increase in plasma resistivity. Specifically, where the frequency of an RF applied to an RF application electrode is set higher, when the RF is supplied from an RF power supply to the electrode backside, it is transmitted through the electrode surface by means of the skin effect and is concentrated at the central portion of the electrode main surface (surface facing the plasma). Consequently, the electric field intensity at the central portion of the electrode main surface becomes higher than the electric field intensity at the peripheral portion, so the density of generated plasma becomes higher at the electrode central portion than at the electrode peripheral portion. Thus the plasma resistivity becomes lower at the electrode central portion where the plasma density is higher, so an electric current is concentrated at the central portion of the counter electrode. As a result, the uniformity of the plasma density is further deteriorated, which brings about a poor planar uniformity and charge-up damage in plasma processing, such as etching In order to solve this problem, a design is known in which the main surface central portion of an RF application electrode is formed of a high resistivity member (for example, Patent Document 1: Jpn. Pat. Appln. KOKAI Publication No. 2000-323456). According to this technique, the high resistivity member is employed for the main surface central portion of the RF application electrode to consume more RF power as Joule heat there. As a consequence, the electric field intensity on the main surface of the RF application electrode is more reduced at the electrode central portion than at the electrode peripheral portion, so that the poor uniformity described above in plasma density is remedied. However, the high resistivity member employed for the main surface central portion of an RF application electrode may consume too much RF power as Joule heat (energy loss), resulting in a low efficiency.

BRIEF SUMMARY OF THE INVENTION

An object of the present invention to provide a plasma processing apparatus of the capacitive coupling type, which brings about a high planar uniformity of plasma processing, and prevents charge-up damage.

According to a first aspect of the present invention, there is provided a capacitive coupling plasma processing apparatus comprising:

a process chamber configured to have a vacuum atmosphere;

a process gas supply section configured to supply a process gas into the chamber;

a first electrode disposed in the chamber;

a second electrode disposed opposite the first electrode in the chamber;

an RF power supply configured to supply an RF power to the first or second electrode to form an RF electric field within a plasma generation region between the first and second electrodes, so as to turn the process gas into plasma by the RF electric field;

a support member configured to support the target substrate between the first and second electrodes such that a process target surface of the target substrate faces the second electrode; and a conductive functional surface disposed in a surrounding region around the plasma generation region and grounded to expand the plasma outside the plasma generation region, the functional surface being prepared to be coupled with the plasma essentially in a sense of DC.

In the apparatus according to the first aspect, when plasma is generated in the chamber, an electric current flows from the plasma to the functional surface disposed around the target substrate. In this case, the plasma is expanded outward and thereby results in a uniform electron density distribution. Consequently, it is possible to improve the planar uniformity of the plasma process, and reduce the charge-up damage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will now be described with reference to the accompanying drawings. In the following description, the constituent elements having substantially the same function and arrangement are denoted by the same reference numerals, and a repetitive description will be made only when necessary.

First Embodiment

Figure 1:
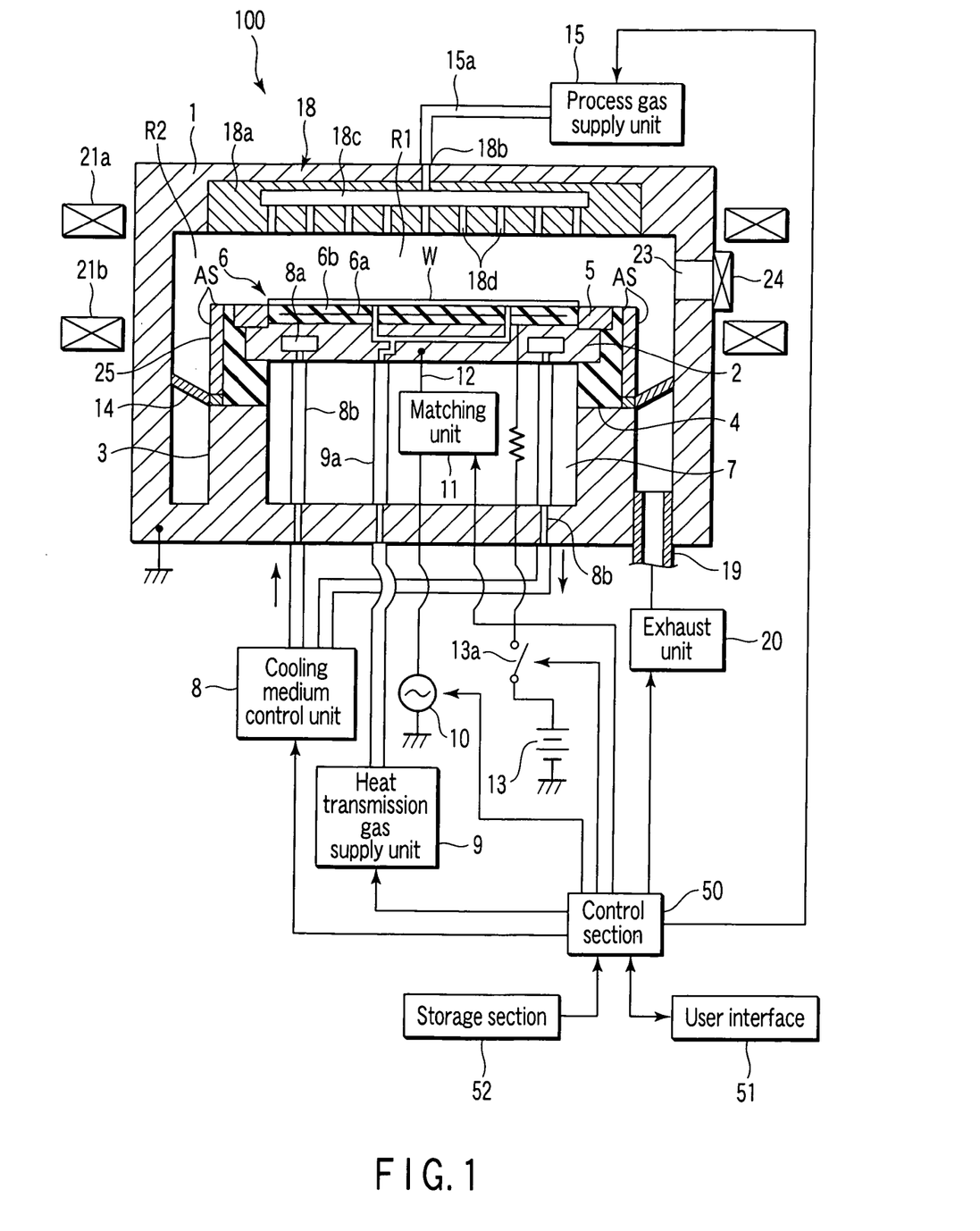
FIG. 1 is a sectional view showing a plasma etching apparatus as a plasma processing apparatus according to a first embodiment of the present invention.

FIG. 1 is a sectional view showing a plasma etching apparatus as a plasma processing apparatus according to a first embodiment of the present invention. This apparatus is arranged to etch an oxide film ($SiO_2$ film) disposed on a semiconductor wafer.

This plasma etching apparatus 100 includes an airtight process chamber 1 having an essentially cylindrical shape. For example, the chamber 1 has a main body made of a metal, such as aluminum, with an inner surface covered with an insulating film formed thereon, such as an oxidization processed film, or insulative ceramic film of, e.g. $Y_2O_3$ (for example, a thermal spraying film). The chamber 1 is grounded.

A support table 2 is disposed in the chamber 1 and configured to horizontally support a target substrate or wafer W and to also serve as a lower electrode. For example, the support table 2 is made of aluminum with an oxidization processed surface. A support portion 3 having a ring shape extends upward from the bottom of the chamber 1 at a position corresponding to the periphery of the support table 2. An insulating member 4 having a ring shape is disposed on the support portion 3, to support the periphery of the support table 2.

A conductive shield member 25 having a ring shape is disposed on the support portion 3 to surround the insulating member 4. The upper end of the shield member 25 is set at a height nearly equal to the top surface of the wafer W. The shield member 25 is grounded in a sense of DC (direct current) through the chamber 1 or an exhaust ring 14 described later and the chamber 1. Further, a focus ring 5 made of a conductive material, such as Si or SiC, is placed on the periphery of the top of the support table 2. A conical exhaust ring 14 is disposed between the lower end of the shield member 25 and the wall of the chamber 1. The exhaust ring 14 is configured to allow the process gas to pas therethrough toward an exhaust line, and to define a surrounding region around a plasma generation region, as described later. The surface of the exhaust ring 14 is also covered with an insulating film of an insulative ceramic, such as $Y_2O_3$. An inner void 7 is formed between the support table 2 and the bottom of the chamber 1.

The support table 2 is provided with an electrostatic chuck 6 on the top surface, for holding a wafer W by an electrostatic attraction force. The electrostatic chuck 6 comprises an electrode 6a and a pair of insulating layers 6b sandwiching the electrode 6. The electrode 6 is connected to a DC (direct current) power supply 13 through a switch 13a. The semiconductor wafer W is attracted and held by an electrostatic force, e.g. a Coulomb force, generated by a voltage applied from the DC power supply 13 to the electrode 6a.

A cooling medium passage 8a is formed in the support table 2, and is connected to cooling medium lines 8b. A suitable cooling medium is supplied and circulated within the cooling medium passage 8a from a cooling medium control unit 8 through the cooling medium lines 8b to control the support table 2 at a suitable temperature. Further, a heat transmission gas line 9a is disposed to supply a heat transmission gas, such as He gas, into the interstice between the top surface of the electrostatic chuck 6 and the bottom surface of the wafer W. The heat transmission gas is supplied from a heat transmission gas supply unit 9 through the gas line 9a to the bottom surface of the wafer W. Consequently, even when the interior of the chamber 1 is exhausted and maintained in a vacuum state, cold of the cooling medium circulated in the cooling medium passage 8a is efficiently transmitted, thereby improving the temperature control of the wafer W.

A power feed line 12 for supplying an RF (radio frequency) power is connected near the center of the support table 2. The power feed line 12 is connected to a matching unit 11 and an RF power supply 10. The RF power supply 10 is configured to supply an RF power with a predetermined frequency to the support table 2.

On the other hand, a showerhead 18 used as an upper electrode (thus which will be also referred to as an upper electrode 18) is disposed above and opposite the support table 2. The showerhead 18 is fitted in the ceiling of the chamber 1. The showerhead 18 includes a conductive main body 18a, and a number of gas delivery holes 18d are formed to penetrate a lower portion of the main body 18a. The gas delivery holes 18d communicate with a space 18c formed in the main body 18a and a gas supply port 18b formed at the top of the main body 18a. The gas supply port 18b is connected through a gas supply line 15a to a process gas supply unit 15 for supplying a process gas for etching.

The upper electrode 18 is grounded through the chamber 1 and cooperates with the lower electrode or support table 2 supplied with an RF power, to define a pair of parallel-plate electrodes. The lower electrode or support table 2 supplied with an RF power serves as a cathode electrode, while the grounded upper electrode 18 serves as an anode electrode. A plasma generation region R1 for turning the process gas into plasma is defined between the upper electrode 18 and support table 2. An surrounding region R2 is defined around the plasma generation region R1 and bounded by the exhaust ring 14.

The main body 18a of the upper electrode 18 is made of a metal or semiconductor, such as carbon or Si. The counter surface of the main body 18a facing the support table 2 is covered with an insulating film (see an insulating film 27 described later) for preventing metal contamination, wear-out due to plasma, and generation of scratches. This insulating film is formed of an oxidization processed film, or insulative ceramic film of, e.g. $Y_2O_3$ (for example, a thermal spraying film).

The process gas for etching can be selected from various conventional process gases, and it may be a gas containing a halogen element, such as a fluorocarbon gas ($C_xF_y$) or hydrofluorocarbon gas ($C_pH_qF_r$). The process gas may further contain a rare gas, such as Ar or He, $N_2$ gas, or $O_2$ gas. Where the process gas is used for ashing, the process gas may be, e.g. $O_2$ gas.

The process gas is supplied from the process gas supply unit 15 through the gas supply line 15a and gas supply port 18b into the space 18c inside the main body 18a. Then, the process gas is delivered from the gas delivery holes 18d and used for etching a film formed on the wafer W.

The bottom of the chamber 1 is connected through an exhaust line 19 to an exhaust unit 20 including a vacuum pump or the like. The exhaust unit 20 is configured to reduce the pressure inside the chamber 1 to a predetermined vacuum level by the vacuum pump. A transfer port 23 for the wafer W is formed in the upper portion of the sidewall of the chamber 1, and is opened/closed by a gate valve 24 attached thereon.

On the other hand, two ring magnets 21a and 21b are disposed coaxially around the chamber 1 at positions above and below the transfer port 23 of the chamber 1. The ring magnets 21a and 21b are configured to form a magnetic field around the process space between the support table 2 and upper electrode 18. The ring magnets 21a and 21b are rotatable by a rotation mechanism (not shown).

In each of the ring magnets 21a and 21b, a plurality of segment magnets formed of permanent magnets are disposed to be a ring in a multi-pole state. Specifically, in each of the ring magnets 21a and 21b, the magnetic poles of adjacent segment magnets are oriented in opposite directions. Consequently, magnetic force lines are formed between adjacent segment magnets, such that a magnetic field of, e.g. 0.02 to 0.2 T (200 to 2000 Gauss), and preferably of 0.03 to 0.045 T (300 to 450 Gauss), is formed only around the process space, while essentially no magnetic field is formed at the position where the wafer is placed. Consequently, it is possible to obtain a suitable effect of confining plasma. It should be noted that "essentially no magnetic field is formed at the position where the wafer is placed" is not limited to a case where no magnetic field is present. For example, this concept includes a case where a magnetic field is formed at the position where the wafer is placed, but the magnetic field has essentially no effect on the plasma process.

As described above, the conductive shield member 25 is grounded in a sense of DC through the chamber 1 or the exhaust ring 14 and chamber 1. The shield member 25 disposed in the surrounding region R2 includes a surface serving as a conductive functional surface AS to expand plasma outside the plasma generation region R1. The functional surface AS is prepared to be coupled with plasma in a sense of DC, and disposed concentrically with the wafer W on the support table 3. Specifically, the shield member 25 is made of a conductive material, such as a bare aluminum, aluminum with an anodized surface, Si (doped with an impurity to be conductive), SiC, C (carbon), or W. For example, aluminum with an anodized surface is used, the functional surface AS is covered with an $Al_2O_3$ film, which is insulative. However, the insulating film is thin enough to allow the functional surface AS to be coupled with plasma in a sense of DC.

On the other hand, the chamber 1, upper electrode 18, and exhaust ring 14 are grounded, but the inner surface of the chamber 1, the counter surface of the upper electrode 18, and the surface of the exhaust ring 14 are covered with a $Y_2O_3$ insulating film (which is thicker than the insulating film on the shield member 25). Accordingly, the surfaces of these members are coupled with plasma in a sense of AC (alternate current) or RF. Further, the focus ring 5 is connected to the RF power supply 10 through the support table 2. Accordingly, the component surfaces defining the plasma generation region R1 and surrounding region R2 include no surface prepared to be coupled with plasma in a sense of DC, except for the surface (functional surface AS) of the shield member 25.

Figure 2:
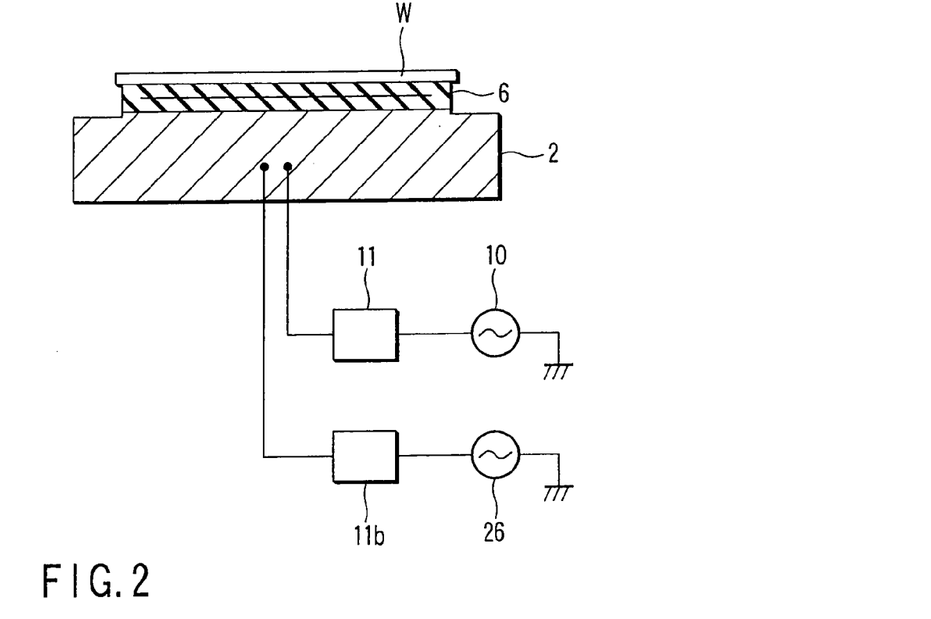
FIG. 2 is a sectional view schematically showing a structure where an RF power supply for plasma generation and an RF power supply for ion attraction are connected to a lower electrode used as a support table.

In order to adjust the plasma density and ion attraction, an RF power for plasma generation may be superposed with an RF power for ion attraction from plasma. Specifically, as shown in FIG. 2, in addition to the RF power supply 10 for plasma generation connected to the matching unit 11, an RF power supply 26 for ion attraction is connected to a matching unit 11b to superpose the RF powers. In this case, the RF power supply 26 for ion attraction is preferably set to have a frequency within a range of 500 KHz to 27 MHz. With this arrangement, ion energy can be controlled to further increase the plasma processing rate, such as an etching rate.

The respective components of the plasma etching apparatus 100 are connected to the control section (process controller) 50 and controlled thereby. Specifically, the control section 50 is configured to control the cooling medium control unit 8, the heat transmission gas supply unit 9, the exhaust unit 20, the switch 13a of the DC power supply 13 for the electrostatic chuck 6, the RF power supply 10, and the matching unit 11.

The control section 50 is connected to a user interface 51 including, e.g. a keyboard and a display, wherein the keyboard is used for a process operator to input commands for operating the plasma etching apparatus 100, and the display is used for showing visualized images of the operational status of the plasma processing apparatus 100.

Further, the control section 50 is connected to a storage section 52 that stores control programs for the control section 50 to control the plasma etching apparatus 100 so as to perform various processes, and programs or recipes for respective components of the plasma etching apparatus 100 to perform processes in accordance with process conditions. Recipes may be stored in a hard disk or semiconductor memory, or stored in a portable storage medium, such as a CDROM or DVD, to be attached to a predetermined position in the storage section 52.

A required recipe is retrieved from the storage section 52 and executed by the control section 50 in accordance with an instruction or the like through the user interface 51. As a consequence, the plasma etching apparatus 100 can perform a predetermined process under the control of the control section 50.

Next, an explanation will be given of a process operation of the plasma etching apparatus having the structure described above.

At first, the gate valve 24 of the plasma etching apparatus 100 shown in FIG. 1 is opened, and a wafer W having a layer to be etched is transferred into the chamber 1 and placed on the support table 2 by a transfer arm. After the transfer arm is retreated therefrom and the gate valve 24 is closed, the interior of the chamber 1 is exhausted by the vacuum pump of the exhaust unit 20 through the exhaust line 19 to set the pressure inside the chamber 1 to be a predetermined vacuum level.

Thereafter, a process gas for etching is supplied from the process gas supply unit 15 into the chamber 1 at a predetermined flow rate, so that the pressure inside the chamber 1 is set to be a predetermined value within a range of, e.g. about 0.13 to 133.3 Pa (1 to 1000 mTorr). While the chamber 1 is maintained at a predetermined pressure, an RF power with a frequency of 40 MHz or more, such as 100 MHz, is applied from the RF power supply 10 to the support table 2. At the same time, a predetermined voltage is applied from the DC power supply 13 to the electrode 6a of the electrostatic chuck 6 to attract and hold the wafer W by, e.g. a Coulomb force.

With the RF power applied to the lower electrode or support table 2 as described above, an RF electric field is formed in the process space (plasma generation region) between the upper electrode or showerhead 18 and the lower electrode or support table 2. The process gas supplied into the process space is turned into plasma by the RF electric field, and the etching target layer on the wafer W is etched by the plasma.

During this etching, a magnetic field is formed around the process space by the ring magnets 21a and 21b configured in a multi-pole state. This magnetic field brings about the effect of suitably confining the plasma to make the plasma more uniform. The magnetic field may have no effect, depending on the type of the film, but, in such a case, the segment magnets can be rotated to form essentially no magnetic field around the process space during the process.

When the magnetic field is formed, the conductive focus ring 5 disposed around the wafer W on the support table 2 expands the area serving as a lower electrode to the focus ring. Consequently, the plasma generation region is enlarged to a position above the focus ring 5, and the plasma generation is promoted on the peripheral portion of the wafer W, thereby improving the etching rate to be more uniform.

Further, the shield member 25 disposed in the surrounding region R2 around the plasma generation region R1 provides the following effects.

Figure 3:
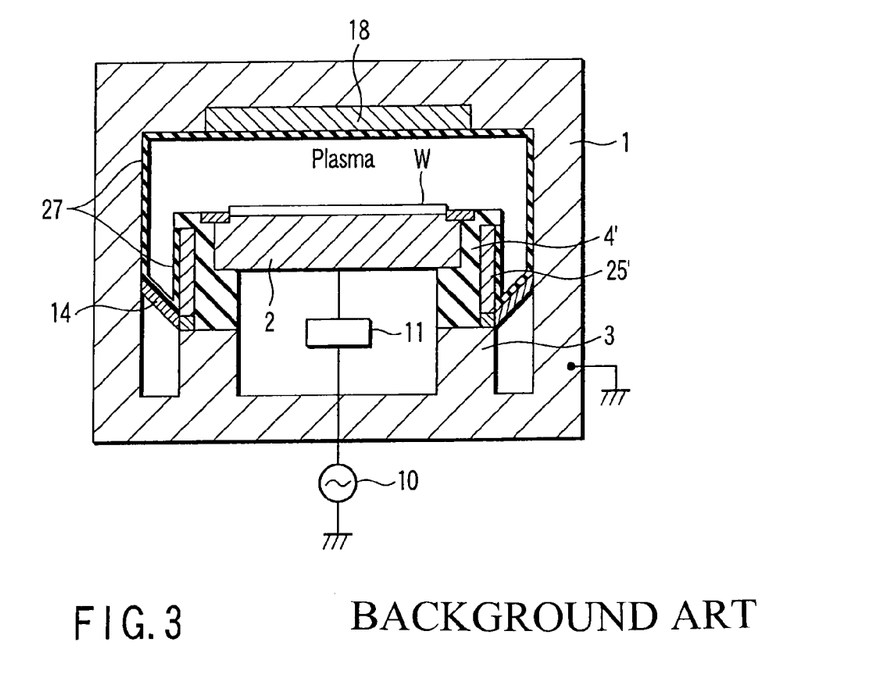
FIG. 3 is a view schematically showing the structure of a conventional plasma etching apparatus.

FIG. 3 is a view schematically showing the structure of a conventional plasma etching apparatus. In this conventional plasma etching apparatus, a shield member 25' is disposed around a support table 2, but the surface of shield member 25' is covered with a $Y_2O_3$ insulating film 27. This insulating film 27 is thick and does not allow the surface of the shield member 25' to be coupled with plasma in a sense of DC. In addition, an insulating member 4' is disposed on the inner side of the shield member 25', and has an overhang portion over the shield member 25'. The other grounded members present inside the chamber 1, such as the chamber 1, upper electrode 18, and exhaust ring 14 are all covered with the insulating film 27, such as a $Y_2O_3$ thermal spraying film, and the insulating member 4'. Accordingly, the surfaces of these members are coupled with plasma not in a sense of DC, but in a sense of AC (or RF). These members thus cannot provide the effect of correcting poor plasma uniformity, but only form a return circuit for an RF electric current.

Figure 4:
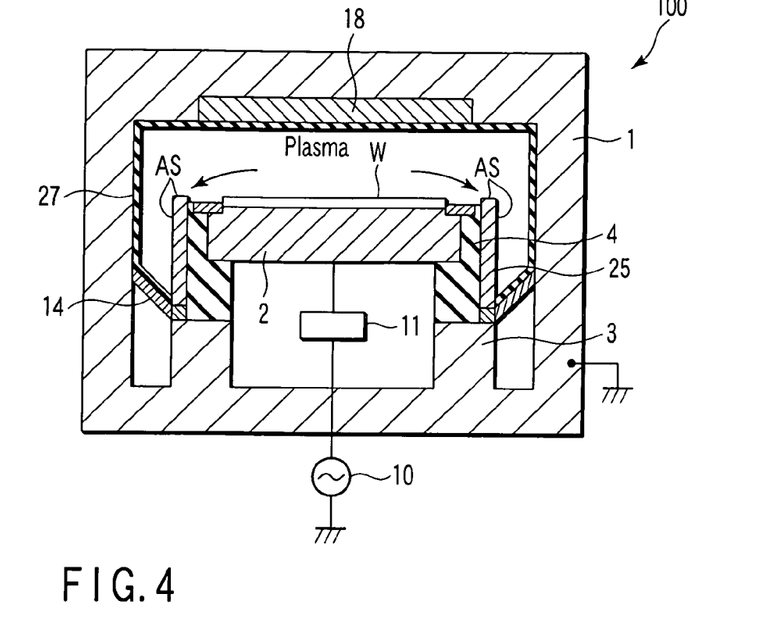
FIG. 4 is a view schematically showing the plasma etching apparatus of FIG. 1 to explain the principles of a mechanism for making the plasma density more uniform.

FIG. 4 is a view schematically showing the plasma etching apparatus of FIG. 1 to explain the principles of a mechanism for making the plasma density more uniform. As described above, the conductive shield member 25 grounded in a sense of DC has a surface serving as a functional surface AS to be coupled with plasma in a sense of DC. When plasma is generated as shown in FIG. 4, an electric current flows from the plasma to the shield member 25 through the functional surface AS disposed around the wafer W. In this case, the plasma is expanded outward and thereby results in a uniform electron density distribution. Consequently, it is possible to improve the planar uniformity of the etching process, and reduce the charge-up damage, such as dielectric breakdown of a gate oxide film.

The multi-pole ring magnets 21a and 21b are arranged to provide the effect of confining plasma so as to prevent plasma diffusion at the periphery of the plasma generation region R1. That is, the multi-pole ring magnets 21a and 21b have a function opposite to that of the shield member 25 which provides the effect of expanding plasma at the central portion. Accordingly, where a magnetic field is formed by the multi-pole ring magnets 21a and 21b, the conditions of the multi-pole ring magnets 21a and 21b should be set not to disturb the effect of expanding plasma provided by the shield member 25.

In order to provide the effect of expanding plasma outward to make the plasma density more uniform, as described above, the upper end of the functional surface AS of the shield member 25 may be located at a position higher than the wafer W. In this case, an electric current more easily flows to the shield member 25 from the plasma.

Figure 5:
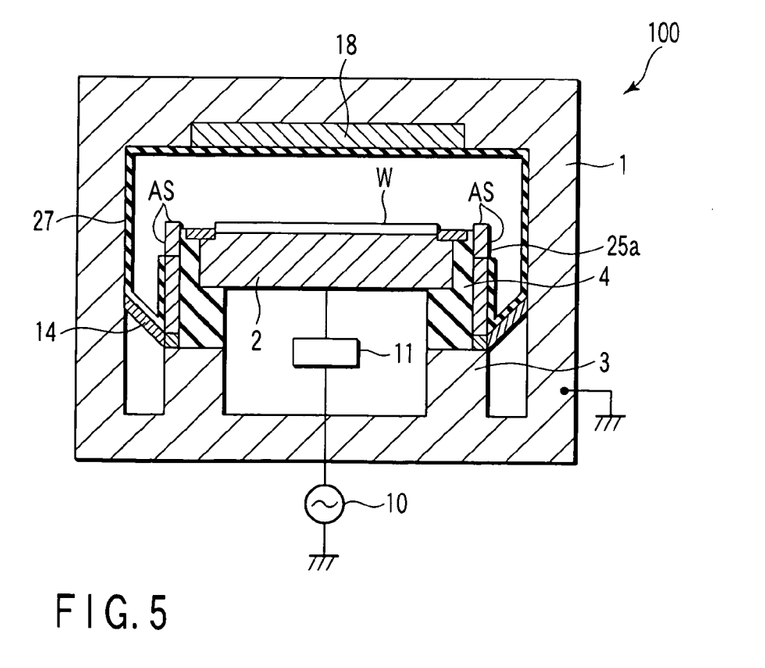
FIG. 5 is a view schematically showing a modification of the plasma etching apparatus according to the first embodiment.

FIG. 5 is a view schematically showing a modification of the plasma etching apparatus according to the first embodiment. In the structure shown in FIG. 1, the upper end surface of the shield member 25 and the entire side surface thereof facing the exhaust passage serve a functional surface AS to be coupled with plasma in a sense of DC. On the other hand, in the modification shown in FIG. 5, a lower portion of the shield member 25 is covered with a thick insulating film 27. Thus the surface of only an upper portion 25a of the shield member 25 serves as a functional surface AS to be coupled with plasma in a sense of DC., This structure can also provide the effect of expanding plasma outward to make the plasma density more uniform.

Figure 6:
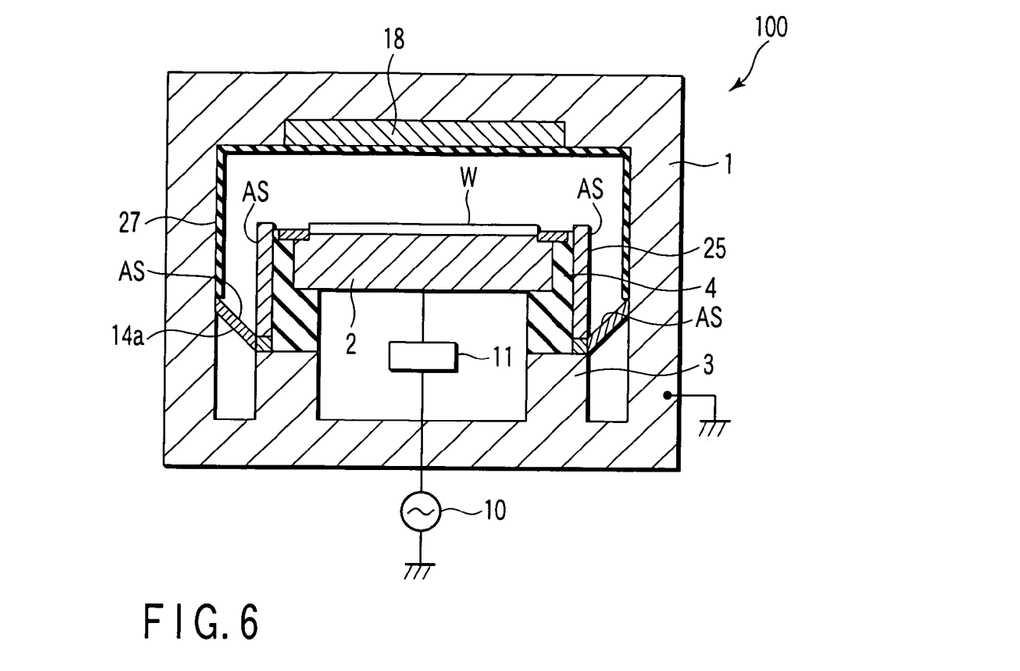
FIG. 6 is a view schematically showing an alternative modification of the plasma etching apparatus according to the first embodiment.

FIG. 6 is a view schematically showing an alternative modification of the plasma etching apparatus according to the first embodiment. In the modification shown in FIG. 6, an exhaust ring 14a with a surface not covered with an insulating film is used, so that, in addition to the shield member 25, the upper surface of the exhaust ring 14a serves as a functional surface AS to be coupled with plasma in a sense of DC. With this arrangement, an electric current flows from plasma toward the shield member 25 and exhaust ring 14a outside the wafer W, thereby providing the effect of expanding plasma outward to make the plasma density more uniform. In this case, the shield member 25 may be covered with a thick insulating film, so that the upper surface of the exhaust ring 14a solely serves as a functional surface AS to be coupled with plasma in a sense of DC.

Figure 7:
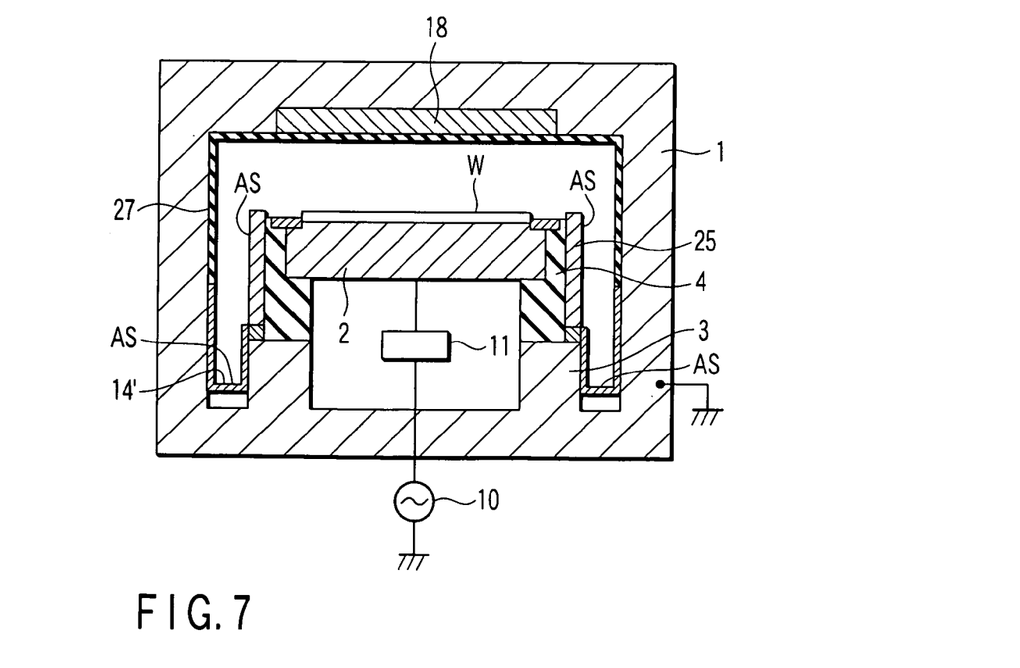
FIG. 7 is a view schematically showing a further alternative modification of the plasma etching apparatus according to the first embodiment.

FIG. 7 is a view schematically showing a further alternative modification of the plasma etching apparatus according to the first embodiment. In the modification shown in FIG. 7, an exhaust ring 14' is disposed near the bottom of the chamber 1, which is far lower than the position of the exhaust ring 14 shown in FIG. 1. The surrounding region around the plasma generation region is thus extended downward. The surfaces of the exhaust ring 14' and shield member 25 are prepared as a functional surface AS to be coupled with plasma in a sense of DC. This arrangement can enhance the effect of expanding plasma outward to make the plasma density more uniform. Also in this case, the shield member 25 may be covered with a thick insulating film, so that the upper surface of the exhaust ring 14' solely serves as a functional surface AS to be coupled with plasma in a sense of DC.

Next, an explanation will be given of experiments performed to confirm advantages of the first embodiment.

Experiment 1

At first, using an apparatus of the same basic structure as that shown in FIG. 1, a plasma process was performed with the shield member 25 at different heights, and the self-bias voltage Vdc of plasma was measured to check the planar fluctuation thereof. The shield member 25 was made of aluminum covered with an anodized film formed on the surface. Three present examples A, B, and C according to the first embodiment were prepared to set the upper end of the shield member at different heights, and examined. In the present example A, the height of the upper end of the shield member was set to be the same as that of the upper end of the support table (Z=0). In the present example B, the height of the upper end of the shield member was set to be 4.5 mm above the support table, i.e. almost the same as the height of the wafer surface (Z=+4.5). In the present example C, the height of the upper end of the shield member was set to be 9.5 mm above the support table (Z=+9.5). Further, for comparison, a conventional apparatus (a comparative example D) in which a shield member covered with a thick insulating film was disposed as shown in FIG. 3 was prepared (Z=−30) and examined in the same way.

The plasma process was performed on a 300 mm wafer under the conditions of: the pressure inside the chamber was set at 0.67 Pa, the process gas was $O_2$ gas with a flow rate of 200 mL/min, and the RF power was set to be with a frequency of 100 MHz at 200 W, 500 W, 1200 W, 1800 W, and 2400 W. The self-bias voltage Vdc at positions directly above the wafer was measured by a Vdc monitor built in the matching unit to obtain the planar distribution of Vdc.

Figure 8:
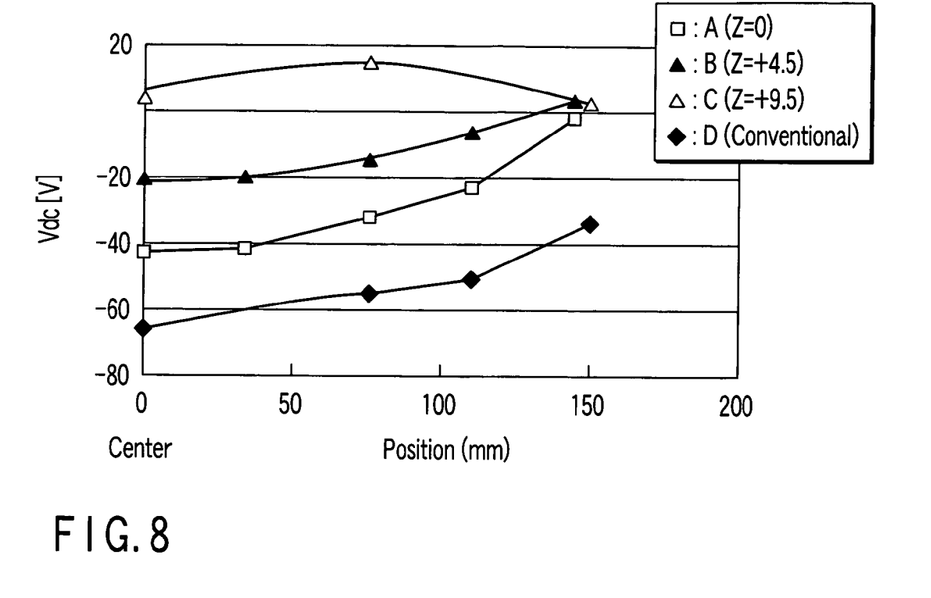
FIG. 8 is a graph showing Vdc values at positions on a wafer surface, obtained by present examples according to the first embodiment with different heights of a shield member, and a comparative example according to a conventional technique.
Figure 9:
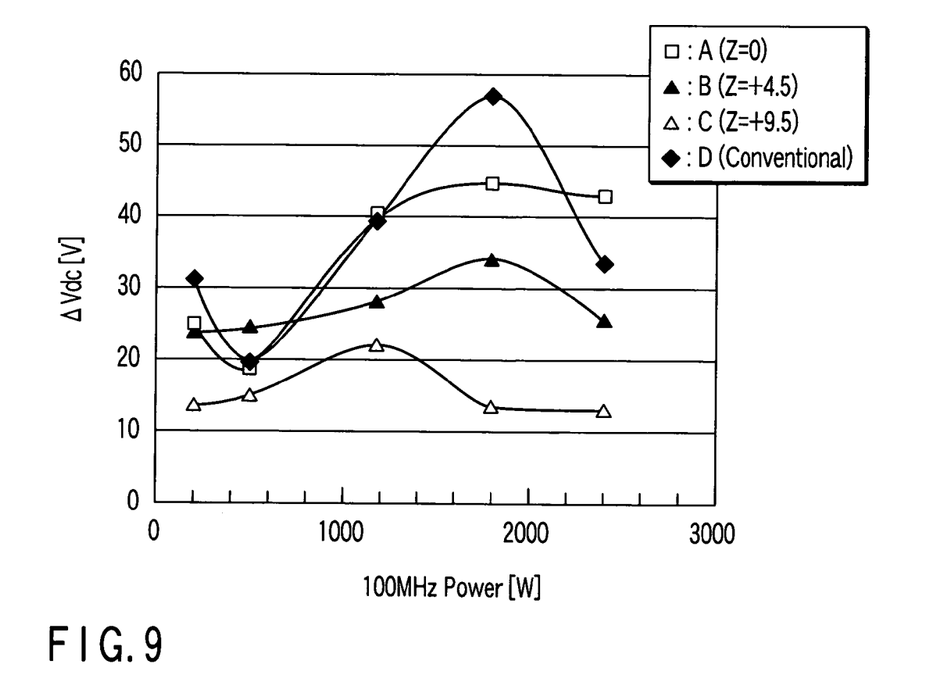
FIG. 9 is a graph showing the power-dependence of ΔVdc, obtained by the present examples and comparative example mentioned in FIG. 8.

The results of this experiment are shown in FIGS. 8 and 9. FIG. 8 is a graph showing Vdc values at positions on the wafer surface, obtained by the present examples according to the first embodiment with the shield member at different heights, and the comparative example according to a conventional technique. FIG. 9 is a graph showing the power-dependence of ΔVdc, obtained by the present examples and comparative example mentioned in FIG. 8.

As shown in FIGS. 8 and 9, in the conventional apparatus (comparative example D), values of Vdc were deep as a whole, values of ΔVdc were large, and the power-dependence of ΔVdc was high. On the other hand, in the present example A to C provided with a shield member having a functional surface to be coupled with plasma in a sense of DC, values of Vdc were shallower, values of ΔVdc were smaller, and the power-dependence of ΔVdc was lower. Further, within the experimental range, as the shield member was higher, the value of Vdc was larger, the value of ΔVdc was smaller, and the power-dependence of ΔVdc was lower. Particularly, the present example C, in which the height of the upper end of the shield member was higher than the wafer surface, rendered the best result.

Experiment 2

Next, the effect of the exhaust ring was examined, while the shield member was set at a height of Z=0. Two present examples E and F according to the first embodiment were prepared with different structures of the exhaust ring. In the present example E (which was the same as the present example A), a conical exhaust ring was used, as shown in FIG. 1 (having a height of −30 to −110 mm and covered with an insulating film). In the present example F, an exhaust ring was disposed near the bottom of the chamber as shown in FIG. 7 (having a height of −170 mm), while the exhaust ring was prepared to provide a functional surface to be coupled with plasma in a sense of DC. The plasma process was performed on a 300 mm wafer under the same conditions as the experiment 1. The self-bias voltage Vdc at positions directly above the wafer was measured by a Vdc monitor built in the matching unit to obtain the planar distribution of Vdc.

Figure 10:
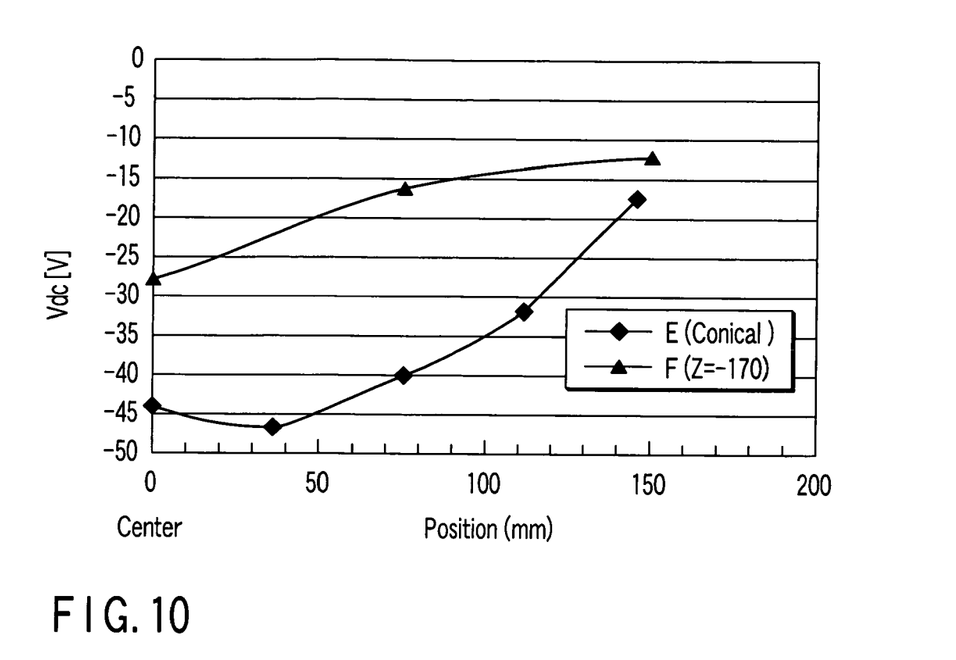
FIG. 10 is a graph showing Vdc values at positions on a wafer surface, obtained by present examples according to the first embodiment with different positions of an exhaust ring.
Figure 11:
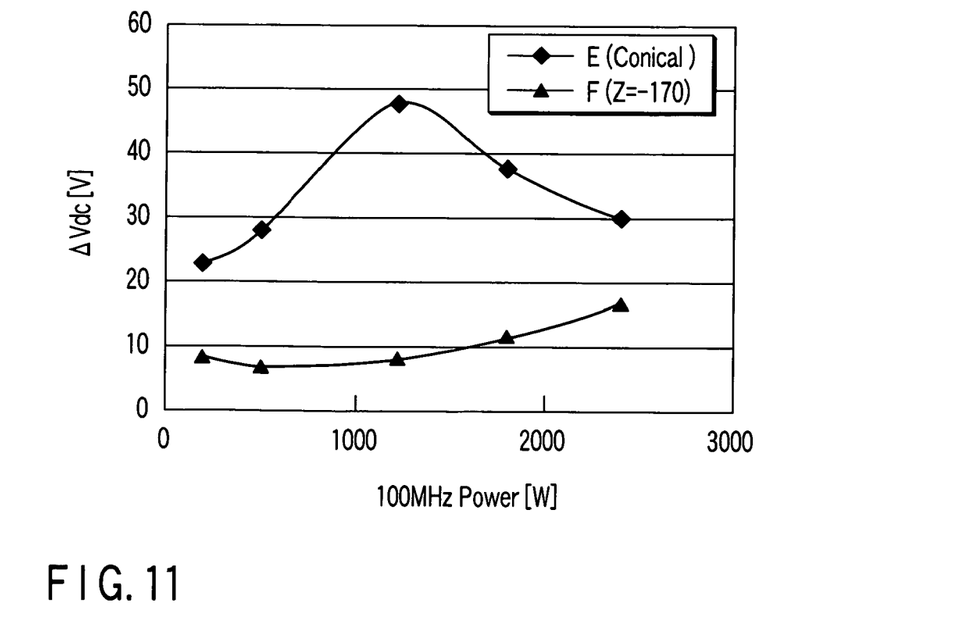
FIG. 11 is a graph showing the power-dependence of ΔVdc, obtained by the present examples mentioned in FIG. 10.

The results of this experiment are shown in FIGS. 10 and 11. FIG. 10 is a graph showing Vdc values at positions on the wafer surface, obtained by the present examples according to the first embodiment with different positions of an exhaust ring. FIG. 11 is a graph showing the power-dependence of ΔVdc, obtained by the present examples mentioned in FIG. 10.

As shown in FIGS. 10 and 11, the present example F, in which the exhaust ring was disposed at a lower position and prepared to provide a functional surface, rendered a large Vdc value, a very small value of ΔVdc, and a very low power-dependence of ΔVdc.

Second Embodiment

Figure 12:
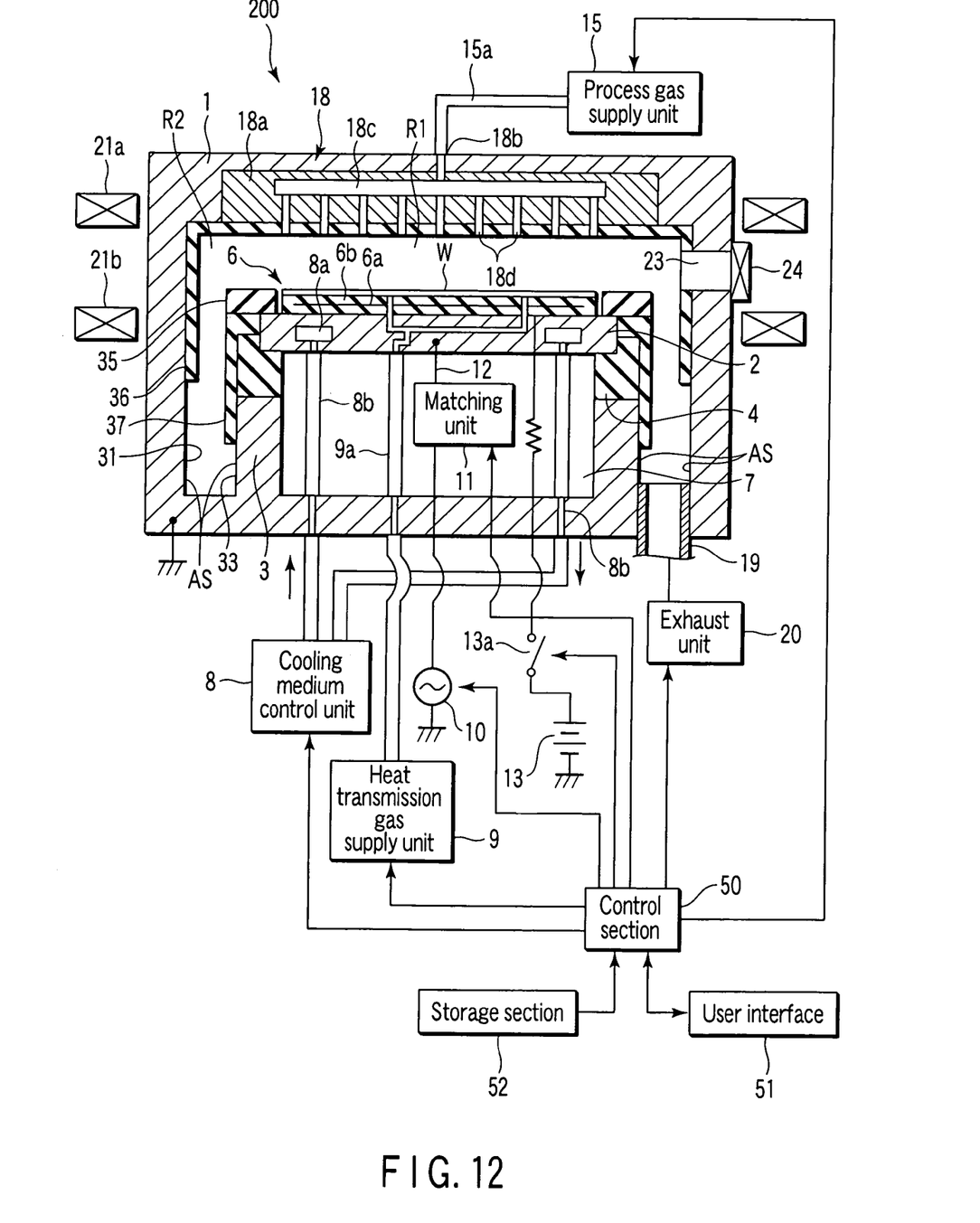
FIG. 12 is a sectional view showing a plasma etching apparatus as a plasma processing apparatus according to a second embodiment of the present invention.

FIG. 12 is a sectional view showing a plasma etching apparatus as a plasma processing apparatus according to a second embodiment of the present invention. This apparatus is arranged to etch an Si layer or Si substrate surface disposed on a semiconductor wafer. Since the apparatus shown in FIG. 12 has a basic structure essentially the same as that shown in FIG. 1, the following explanation will be given, focusing on the differences.

This plasma etching apparatus 200 includes a support portion 3 that has a ring shape and extends upward from the bottom of a process chamber 1. An insulating member 4 having a ring shape is disposed on the support portion 3, to support the periphery of a support table 2. A focus ring 35 made of an insulative material, such as $SiO_2$, is placed on the periphery of the top of the support table 2. The insulating member 4, an upper outer surface of the support portion 3, most of the inner surface of the chamber 1, and the surface of the upper electrode 18 facing the support table 2 are covered with insulating covers 36 and 37 made of, e.g. quartz. However, a lower outer surface of the support portion 3 and a lower inner surface of the chamber 1 are not covered with these quartz covers, and they serve as exposed surfaces 33 and 31 where aluminum (conductive material) is exposed while being covered with a thin anodized oxide film. There is no exhaust ring disposed between the insulating cover 37 and the wall of the chamber 1, and thus a surrounding region R2 defined around a plasma generation region R1 is extended to the bottom of the chamber 1 along an exhaust passage.

Next, an explanation will be given of a process operation of the plasma etching apparatus having the structure described above.

At first, as in the first embodiment, a wafer W having a layer to be etched is transferred into the chamber 1. Then, the interior of the chamber 1 is exhausted by the vacuum pump of an exhaust unit 20 to set the pressure inside the chamber 1 to be a predetermined vacuum level.

Thereafter, a process gas for etching is supplied from a process gas supply unit 15 into the chamber 1 at a predetermined flow rate, so that the pressure inside the chamber 1 is set to be a predetermined value within a range of, e.g. about 0.13 to 133.3 Pa (1 to 1000 mTorr). While the chamber 1 is maintained at a predetermined pressure, an RF power with a frequency of 40 MHz or more, such as 100 MHz, is applied from the RF power supply 10 to the support table 2. At the same time, a predetermined voltage is applied from a DC power supply 13 to the electrode 6a of an electrostatic chuck 6 to attract and hold the wafer W by, e.g. a Coulomb force.

With the RF power applied to the lower electrode or support table 2 as described above, an RF electric field is formed in the process space (plasma generation region) between the upper electrode or showerhead 18 and the lower electrode or support table 2. The process gas supplied into the process space is turned into plasma by the RF electric field, and the etching target layer on the wafer W is etched by the plasma.

During this etching, a magnetic field is formed around the process space by ring magnets 21a and 21b configured in a multi-pole state. This magnetic field brings about the effect of suitably confining the plasma to make the plasma more uniform. The magnetic field may have no effect, depending on the type of the film, but, in such a case, the segment magnets can be rotated to form essentially no magnetic field around the process space during the process.

When the magnetic field is formed, the insulative focus ring 35 disposed around the wafer W on the support table 2 cannot transfer electric charges to and from electrons and ions in the plasma. In this case, the effect of confining plasma is enhanced, thereby improving the etching rate to be more uniform.

Further, the exposed surfaces 31 and 33 disposed in the surrounding region R2 around the plasma generation region R1 provides the following effects.

As described previously with reference to FIG. 3, according to the conventional plasma etching apparatus for Si etching, the surfaces of the conductive components that define the plasma generation region R1 and surrounding region R2 are all covered with insulating covers. Accordingly, these components cannot provide the effect of correcting poor plasma uniformity, but only form a return circuit for an RF electric current.

On the other hand, according to the second embodiment, no insulating covers are present near the bottom of the surrounding region R2 so as to form the conductive exposed surfaces 31 and 33 grounded through the chamber 1. These exposed surfaces 31 and 33 are covered with an $Al_2O_3$ film, which is insulative, but the insulating film is thin enough to allow the exposed surfaces 31 and 33 to be coupled with plasma in a sense of DC. Consequently, the exposed surfaces 31 and 33 serve as functional surfaces AS to be coupled with plasma in a sense of DC so as to expand plasma outside the plasma generation region R1.

Figure 13:
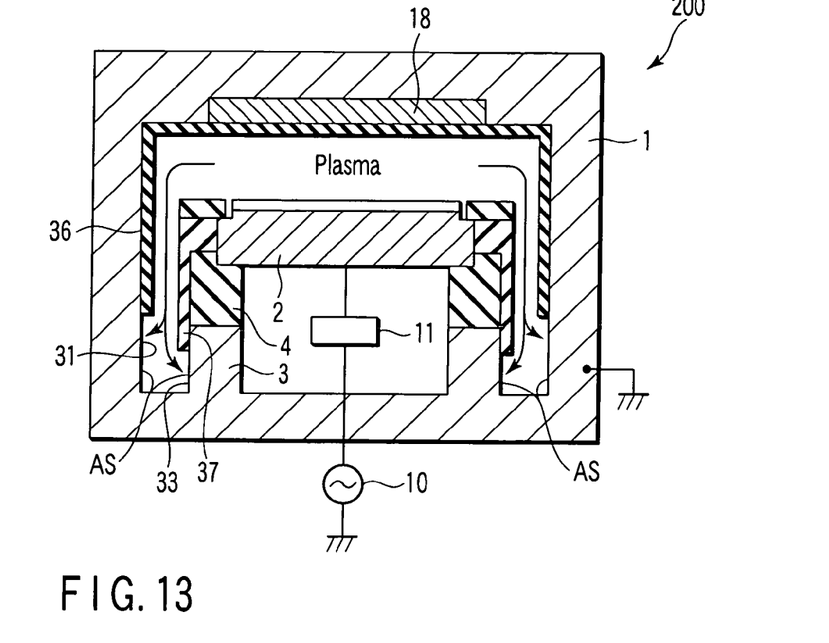
FIG. 13 is a view schematically showing the plasma etching apparatus of FIG. 12 to explain the principles of a mechanism for making the plasma density more uniform.

FIG. 13 is a view schematically showing the plasma etching apparatus of FIG. 12 to explain the principles of a mechanism for making the plasma density more uniform. When plasma is generated as shown in FIG. 13, an electric current flows from the plasma to the chamber 1 and support portion 3 through the functional surfaces AS disposed around the wafer W. In this case, the plasma is expanded outward and thereby results in a uniform electron density distribution. Consequently, it is possible to improve the planar uniformity of the etching process, and reduce the charge-up damage, such as dielectric breakdown of a gate oxide film. Although both of the exposed surfaces 31 and 33 are preferably formed to obtain the effect described above, only one of the exposed surfaces 31 and 33 may be formed for the same purpose.

Figure 14:
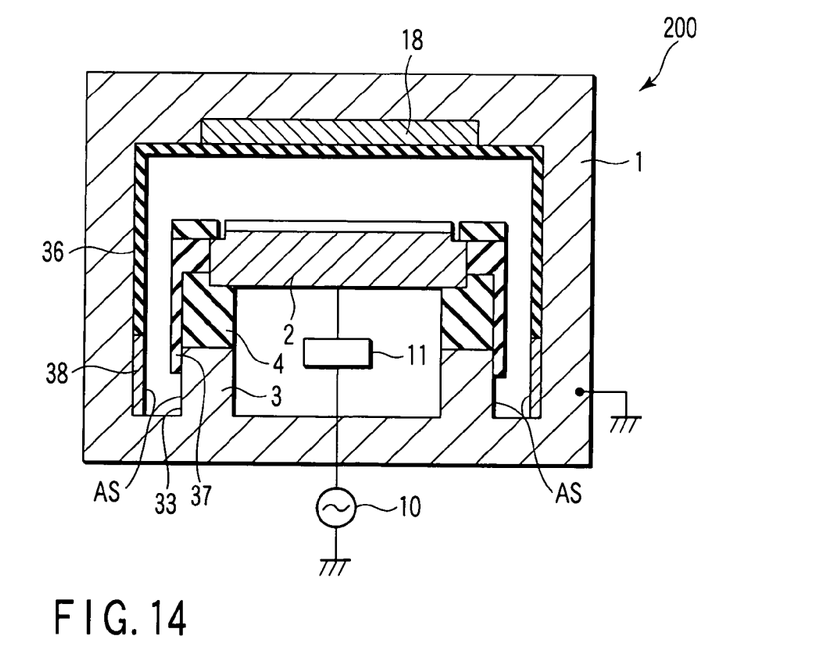
FIG. 14 is a view schematically showing a modification of the plasma etching apparatus according to the second embodiment.
Figure 15:
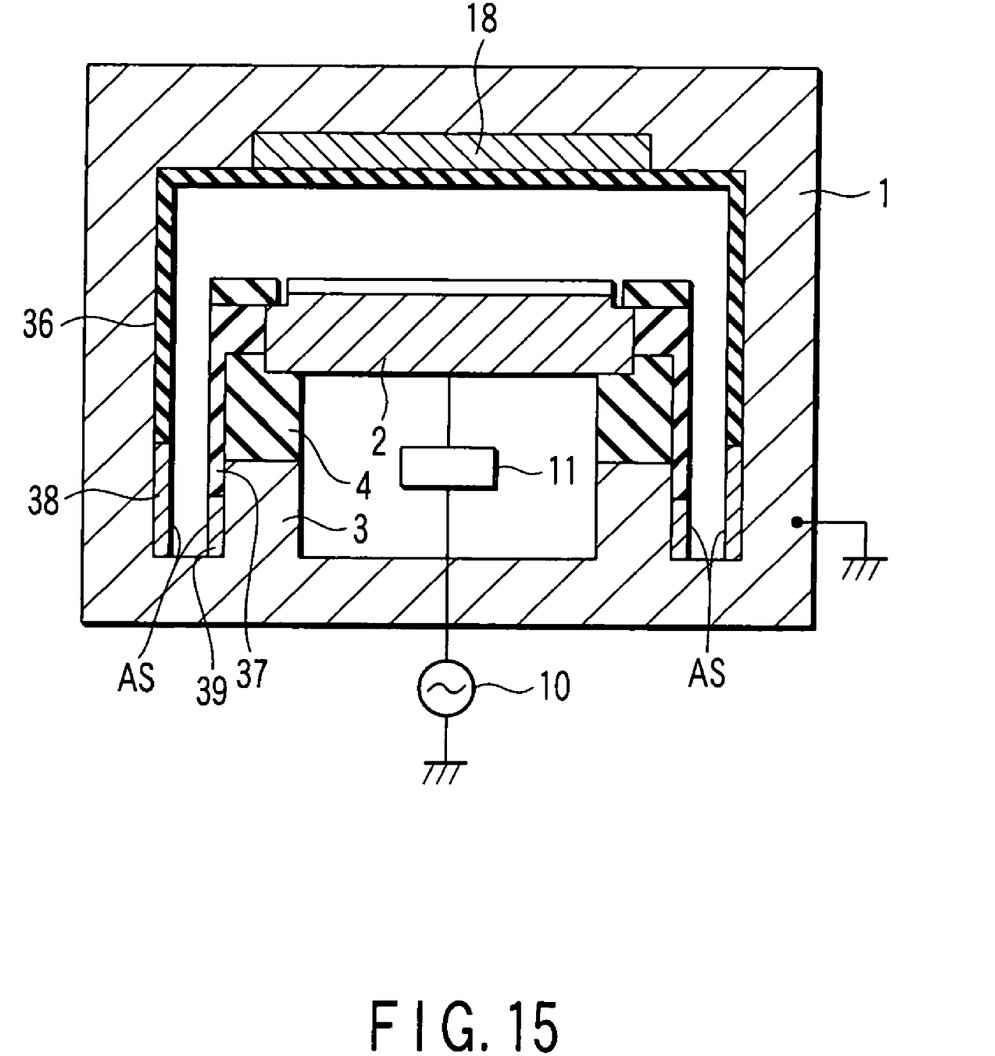
FIG. 15 is a view schematically showing an alternative modification of the plasma etching apparatus according to the second embodiment.

FIG. 14 is a view schematically showing a modification of the plasma etching apparatus according to the second embodiment. FIG. 15 is a view schematically showing an alternative modification of the plasma etching apparatus according to the second embodiment. In the modification shown in FIG. 14, a grounding member 38 providing a functional surface AS is disposed at a position corresponding to the exposed surface 31. In the modification shown in FIG. 15, grounding members 38 and 39, each of which provides a functional surface AS, are disposed at positions corresponding to the exposed surfaces 31 and 33, respectively. Where a grounding member providing a functional surface AS is disposed on an exposed surface, as described above, the effect of making plasma density more uniform can be enhanced.

For example, such a grounding member may be made of bare aluminum, which has a high conductivity. However, in light of stable properties and prevention of contaminants, the grounding member is preferably made of Si. Although the grounding member may be formed of a hollowed-out solid body, this brings about an increase in cost and a difficulty in machining. Particularly, in recent years, as the diameter of wafers increases, components of processing apparatuses become lager, which makes more serious the problems described above in using a solid body.

Figure 16:
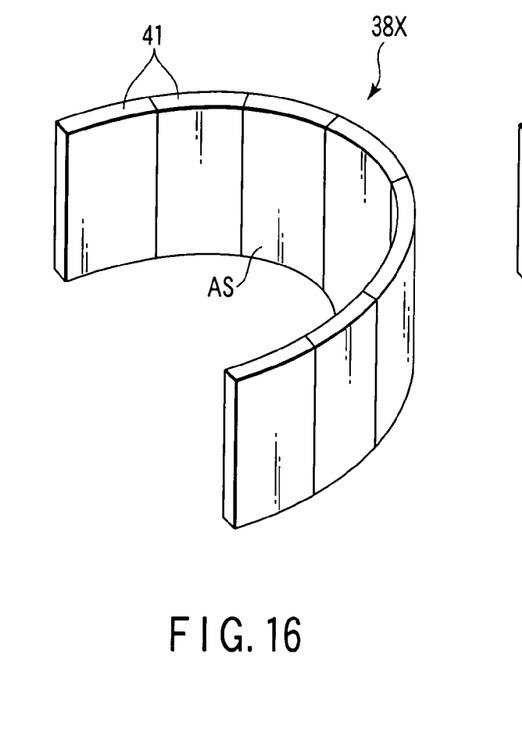
FIG. 16 is a view schematically showing a modification of a grounding member usable in the plasma etching apparatuses shown in FIGS. 14 and 15.

FIG. 16 is a view schematically showing a modification of a grounding member usable in the plasma etching apparatuses shown in FIGS. 14 and 15. In the modification shown in FIG. 16, a grounding member 38X having a ring shape is assembled from a plurality of conductive segments 41, such as Si (doped with an impurity to be conductive) segments. This arrangement can solve the problems in cost and machining described above.

Figure 17:
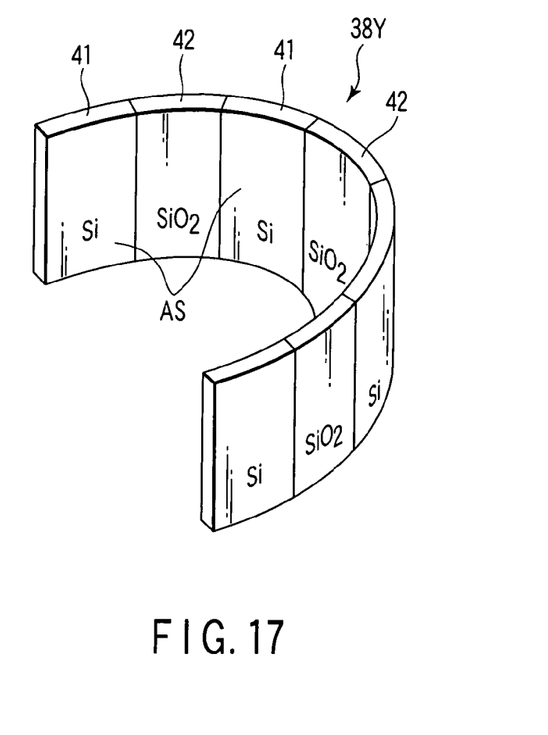
FIG. 17 is a view schematically showing an alternative modification of a grounding member usable in the plasma etching apparatuses shown in FIGS. 14 and 15.
Figure 18:
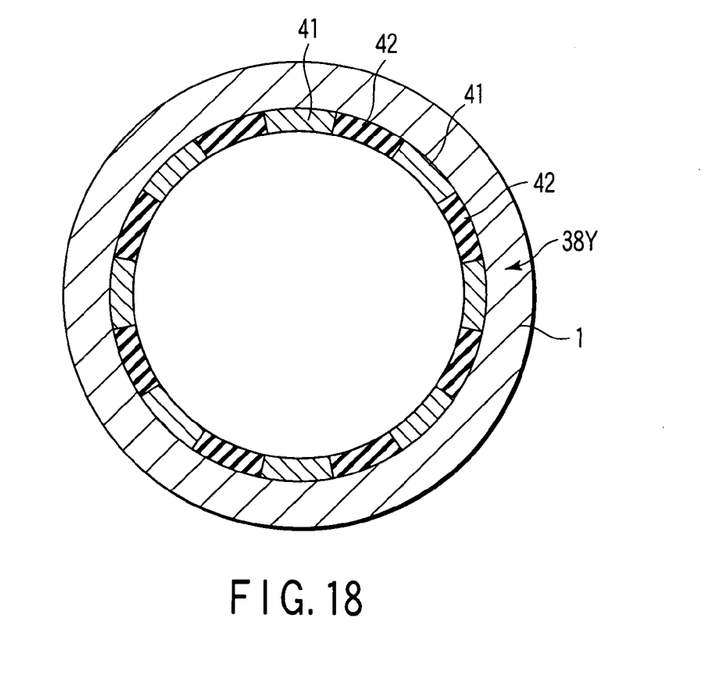
FIG. 18 is a sectional plan view showing the relationship between the grounding member shown in FIG. 17 and a process chamber.

FIG. 17 is a view schematically showing an alternative modification of a grounding member usable in the plasma etching apparatuses shown in FIGS. 14 and 15. FIG. 18 is a sectional plan view showing the relationship between the grounding member shown in FIG. 17 and a process chamber. In the modification shown in FIG. 17, a grounding member 38Y having a ring shape is assembled from a plurality of conductive segments 41, such as Si segment, and a plurality of insulative segments 42, such as quartz ($SiO_2$) segment 42. For example, as shown in FIG. 18, the ring grounding member 38Y is formed of 16 segments arrayed in the annular direction, which are 8 Si segments 41 and 8 quartz segments 42 alternately disposed.

Since quartz is less expensive than Si and has high durability, the grounding member 38Y may be continuously usable while replacing only the Si segments 41. Further, even where grounding member is partly made of $SiO_2$, as described above, it can provide almost the same effect as in the case of only Si being used. The manner for alternately disposing conductive segments and insulative segments is not limited to the structure shown in FIGS. 17 and 18. It should be noted that, in light of stable properties and prevention of contaminants, SiC may be used in place of Si. The grounding member 39 may be modified as in the grounding members 38 X and 38Y. Further, the shield member described in the first embodiment may be modified as in the grounding members 38 X and 38Y Next, an explanation will be given of experiments performed to confirm advantages of the second embodiment.

Experiment 3

At first, using an apparatus of the same basic structure as that shown in FIG. 12 with a lower electrode connected to two RF power supplies of different frequencies as shown in FIG. 2, an Si plasma etching was performed with different conditions of the insulating covers, and the etching shape was observed. As the plasma etching apparatus, two present examples G and H according to the second embodiment were prepared and examined. In the present example G, only the exposed surface 33 was formed on a lower outer surface of the support portion 3. In the present example H, the exposed surface 33 and exposed surface 31 were respectively formed on a lower outer surface of the support portion 3 and a lower inner surface of the chamber 1, respectively. Further, for comparison, a conventional apparatus (a comparative example I) having no exposed surface was prepared and examined in the same way.

The plasma etching was performed to form a hole having a depth of about 10 μm in a 200 mm Si wafer under the conditions of: the pressure inside the chamber was set at 27 Pa, the process gas was HBr, $NF_3$, $SF_6$, $SiF_4$, and $O_2$ and the RF powers were set to be with frequencies of 40 MHz and 3.2 MHz at 600 W and 700 W, respectively. The wafer was etched at a plurality of positions from the center to near edge, and the bottom CD of etched holes was measure to obtain the fluctuation thereof.

As a result, in the comparative example I, the fluctuation (ΔBCD) of the bottom CD was 30 nm. In the present example G having only the exposed surface 33, ΔBCD was 21 nm, i.e. the etching uniformity was improved. Further, the present example H having the exposed surfaces 33 and 31, ΔBCD was 17 nm, i.e. the etching uniformity was further improved.

The present invention is not limited to the embodiments described above, and it may be modified in various manners. For example, in the embodiments described above, the ring magnets are used to form a magnetic field around the process space. Each of the ring magnets has a plurality of segment magnets formed of permanent magnets and disposed around the chamber to be a ring in a multi-pole state. However, such magnetic field forming means is not necessarily required. Further, in the embodiments described above, the processing apparatus is exemplified by the type which applies an RF power to the lower electrode. However, the present invention may be applied to the type which applies an RF power to the upper electrode, or the type which applies an RF power for plasma generation to the upper electrode and an RF power for ion attraction to the lower electrode. Furthermore, in the embodiments described above, the present invention is applied to plasma etching, but it may be applied to another plasma process, such as plasma CVD or sputtering. Similarly, other apparatus components, the material of the conductive layer, and so forth are not limited to those of the embodiments described above, and they may be modified in various manners. Furthermore, in the embodiments described above, the target substrate is a semiconductor wafer, but it may be applied to another substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A capacitive coupling plasma processing apparatus comprising:
   a process chamber configured to have a vacuum atmosphere;
   a process gas supply section configured to supply a process gas into the chamber;
   a first electrode disposed in the chamber;
   a second electrode disposed opposite the first electrode in the chamber;
   an RF power supply configured to supply an RF power to the first or second electrode to form an RF electric field within a plasma generation region between the first and second electrodes, so as to turn the process gas into plasma by the RF electric field; and
   a support member configured to support a target substrate between the first and second electrodes such that a process target surface of the target substrate faces the second electrode;
   wherein the plasma generation region and a surrounding region around the plasma generation region inside the chamber are contained by a chamber inner surface comprising a component surface that is conductive and grounded,
   a functional surface that is conductive and grounded is disposed in the surrounding region to expand the plasma outside the plasma generation region, and
   the functional surface is covered with a first insulator while the component surface is covered with a second insulator, and the first and second insulators differ from each other such that the functional surface is coupled with the plasma in a sense of DC (direct current) while the component surface is not coupled with the plasma in a sense of DC.

2. The apparatus according to claim 1, wherein the functional surface is disposed substantially concentrically with the target substrate supported by the support member.

3. The apparatus according to claim 1, wherein the second insulator is thicker than the first insulator.

4. The apparatus according to claim 1, wherein the functional surface is defined by a surface of a conductive member disposed on one or both of the support member and the chamber.

5. The apparatus according to claim 1, wherein the functional surface is defined by a surface of a conductive portion of one or both of the support member and the chamber.

6. The apparatus according to claim 1, wherein an exhaust passage for exhausting gas from the plasma generation region is formed around the support member, and the functional surface faces the exhaust passage.

7. The apparatus according to claim 6, wherein the functional surface is disposed near a bottom of the chamber inside the exhaust passage.

8. The apparatus according to claim 1, wherein a ring member is supported by the support member or the chamber to surround the support member, and includes a conductive portion having a surface serving as the functional surface.

9. The apparatus according to claim 8, wherein the ring member comprises a conductive shield member disposed on a side surface of the support member.

10. The apparatus according to claim 8, wherein an exhaust passage for exhausting gas from the plasma generation region is formed around the support member, and the ring member comprises a conductive exhaust ring disposed around the support member to partition the exhaust passage and having a hole for allowing gas to pass therethrough.

11. The apparatus according to claim 8, wherein an exhaust passage for exhausting gas from the plasma generation region is formed around the support member, and the ring member is disposed to define part of an inner surface of the exhaust passage.

12. The apparatus according to claim 1, wherein the RF power supply is connected to the first electrode.

13. The apparatus according to claim 1, wherein the first electrode is built in the support member.

14. The apparatus according to claim 1, wherein the RF power has a frequency of 40 MHz or more.

15. The apparatus according to claim 1, wherein the functional surface is disposed inside the chamber at a position that is radially outside a focus ring to be disposed around the first electrode.

16. The apparatus according to claim 1, wherein the first insulator comprises an anodized oxide film of aluminum and the second insulator comprises quartz.

17. The apparatus according to claim 1, wherein the component surface is coupled with the plasma in a sense of AC (alternating current) or RF (radio frequency).

* * * * *